United States Patent
Xiao et al.

(10) Patent No.: US 8,456,852 B2
(45) Date of Patent: Jun. 4, 2013

(54) CARD ASSEMBLY AND ELECTRONIC DEVICE THEREOF

(75) Inventors: Shi-Xin Xiao, Shenzhen (CN); Chung-Yuan Chen, Taipei Hsien (TW); Long-Fong Chen, Taipei Hsien (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 390 days.

(21) Appl. No.: 12/764,116

(22) Filed: Apr. 21, 2010

(65) Prior Publication Data

US 2011/0157846 A1    Jun. 30, 2011

(30) Foreign Application Priority Data

Dec. 28, 2009 (CN) .......................... 2009 1 0312428

(51) Int. Cl.
*H05K 5/00* (2006.01)
(52) U.S. Cl.
USPC .......................................... 361/752; 361/730
(58) Field of Classification Search
USPC ............... 361/737, 752, 728–730, 796, 800, 361/807, 809, 810; 455/575.1–575.3, 575.24
See application file for complete search history.

(56) References Cited

U.S. PATENT DOCUMENTS

| | | | | |
|---|---|---|---|---|
| 5,336,877 A * | 8/1994 | Raab et al. | | 235/475 |
| 5,563,400 A * | 10/1996 | Le Roux | | 235/486 |
| 5,933,328 A * | 8/1999 | Wallace et al. | | 361/737 |
| 6,035,216 A * | 3/2000 | Cheng et al. | | 455/558 |
| 6,101,372 A * | 8/2000 | Kubo | | 455/558 |
| 7,515,438 B2 * | 4/2009 | Lippert et al. | | 361/814 |
| 7,666,017 B2 * | 2/2010 | Chen et al. | | 439/326 |
| 7,889,506 B2 * | 2/2011 | Huang | | 361/737 |
| 2010/0234070 A1 * | 9/2010 | Li et al. | | 455/558 |

* cited by examiner

*Primary Examiner* — Hung S Bui
(74) *Attorney, Agent, or Firm* — Altis Law Group, Inc.

(57) ABSTRACT

A card assembly is used for enabling a first electronic device to be compatible with a card used in a second electronic device. The card assembly defines a first group of specification parameters of the first electronic device to be detachable received in the first electronic device, and further defines a second group of specification parameters of the card. The second group of specification parameters allows the card to be detachable received in the card assembly. When the card assembly, with the card, is received in the first electronic device, the card is directly and electrically connected to the first electronic device.

13 Claims, 2 Drawing Sheets

CARD ASSEMBLY AND ELECTRONIC DEVICE THEREOF

BACKGROUND

1. Technical Field

The present disclosure relates to card assemblies, and particularly to a card assembly compatible with miniaturization.

2. Description of Related Art

Miniaturization of new electronic devices has gone to new levels of technology. Miniaturized devices such as mobile phones, USB mass storage devices, and digital cameras, all use a mini card, such as a subscriber identity module (SIM) card and/or a memory card. This mini card is removable.

However, many traditional electronic devices are still in use, and the corresponding traditional cards are too big to be compatible with the mini electronic devices. Likewise, the mini cards are too small to be compatible with the traditional devices still in use.

Therefore, what is needed is to provide a card assembly, which can address the problem described above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the two views.

DETAILED DESCRIPTION

Figure 1:
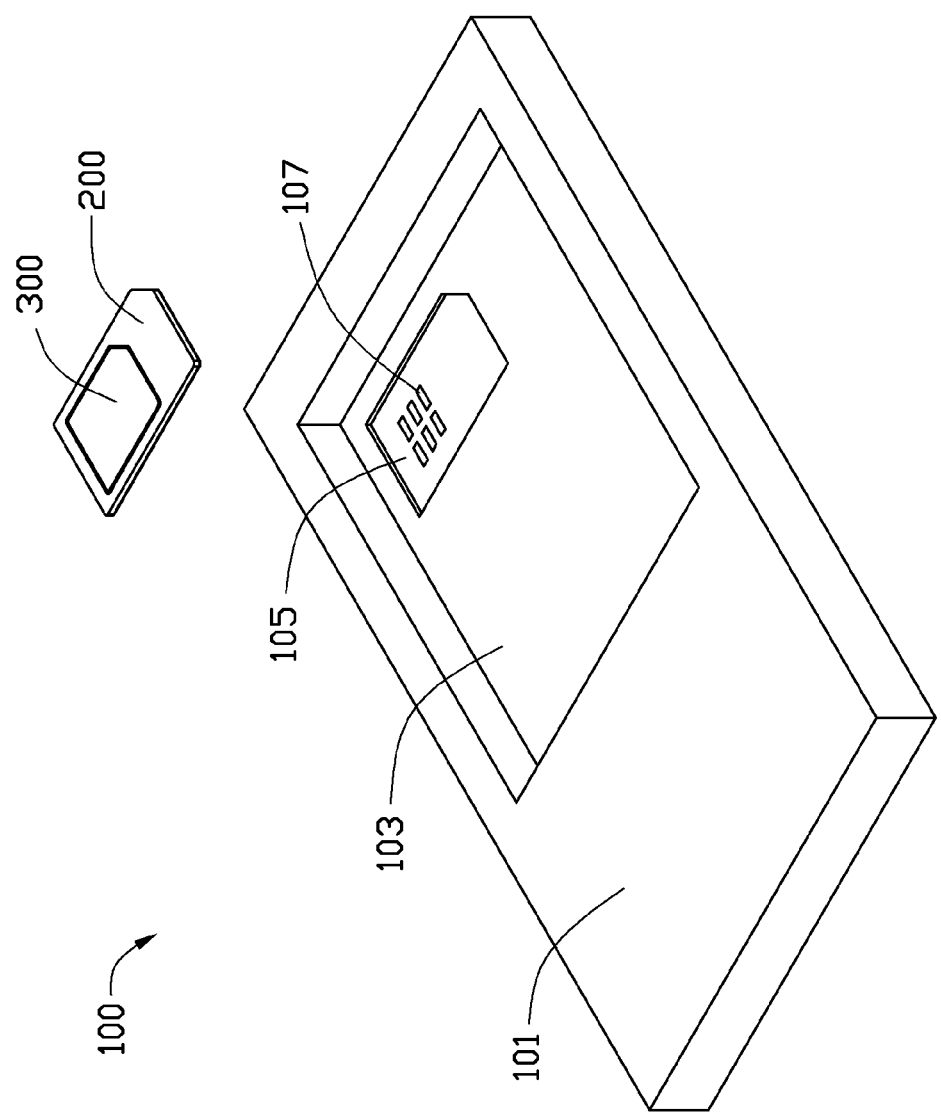
FIG. 1 is an isometric view of an electronic device in accordance with an exemplary embodiment, including a card assembly.

Referring to FIG. 1, an electronic device 100 according to an exemplary embodiment is illustrated. In this embodiment, the electronic device 100 is a traditional mobile phone. A cover and a battery (not shown) are removed from the electronic device 100. The electronic device 100 includes a body 101, a card assembly 200, and a mini card 300.

Figure 2:
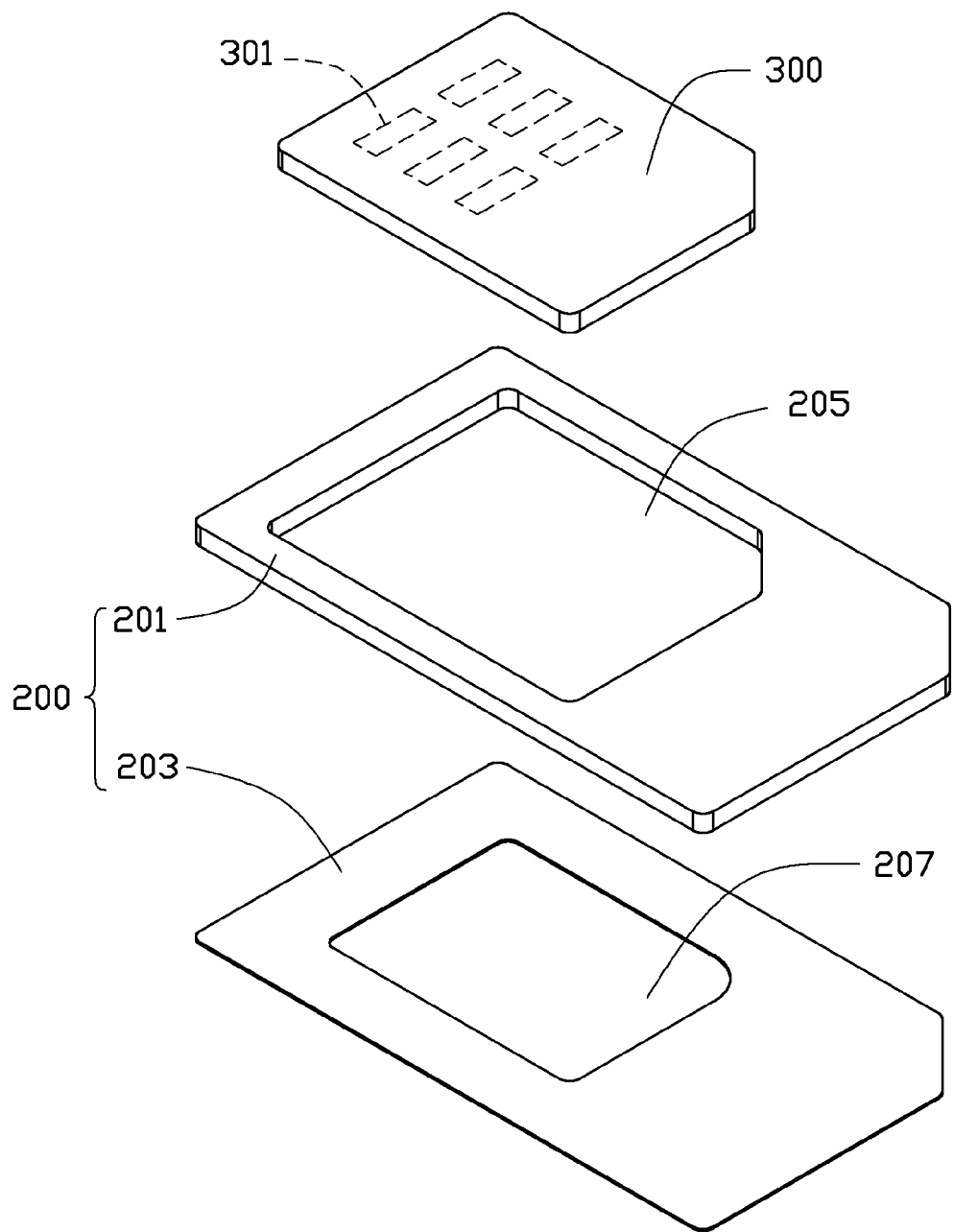
FIG. 2 is an isometric view of the card assembly of FIG. 1.

Further referring to FIG. 2, the mini card 300 defines a first group of specification parameters. In this embodiment, the first group of specification parameters includes a shape and a thickness. The mini card 300 includes a plurality of conductive pads 301. In this embodiment, the mini card 300 is a subscriber identity module (SIM), and is used in miniaturized mobile phones.

The body 101 (FIG. 1) defines a receiving room 103 and a recess 105 communicating with the receiving room 103. The receiving room 103 is configured for receiving the cover and the battery. The recess 105 is defined in the bottom of the receiving room 103, and for receiving the card assembly 200. The recess 105 defines a second group of specification parameters. In this embodiment, the second group of specification parameters also includes a shape and a thickness, and is different from the first group of specification parameters.

The body 101 includes a plurality of conductive ports 107 set in the bottom of the recess 105. The conductive ports 107 corresponding to the conductive pads 301 are electrically connected with a circuit board (not shown) of the electronic device 100. The conductive ports 107 are used for electrically connecting to the corresponding conductive pads 301, to form an electrically connection between the electronic device 100 and the mini card 300.

The card assembly 200 is detachable from the body 101 and configured for receiving the mini card 300. The card assembly 200 includes a housing 201 and a support member 203. The housing 201 has the second group of specification parameters of the recess 105. The size of the housing 201 is relative to the recess 105. The housing 201 further defines a first through hole 205 corresponding to the mini card 300, and through the housing 201. The first through hole 205 has the first group of specification parameters of the mini card 300, and is for receiving the mini card 300. The size of the first through hole 205 is relative to the mini card 300.

The support member 203 is firmly attached on the housing 201, and is for supporting the mini card 300 when the mini card 300 is received in the first through hole 205. The support member 203 defines a second through hole 207 through the support member 203. The second through hole 207 is opposite to the first through hole 205, and is smaller than the first through hole 205 to support the mini card 300.

When the card assembly 200 is received in the recess 105 and the mini card 300 is received in the first through hole 205, the conductive pads 301 are electrically connected to the corresponding conductive ports 107 through the first through hole 205 and second through hole 207.

In this embodiment, the support member 203 is a film, and made of epoxy resin. In other embodiments, the film can be made of plastic, rubber, polycarbonate, or polymethyl methacrylate. The support member 203 is firmly attached to the housing 201 by glue. Thus, when the mini card 300 is received in the first through hole 205, the support member 203 can adhibit the mini card 300, and the mini card 300 cannot easily be removed from the first through hole 205. In other embodiments, the mini card 300 can be affixed with a sticker, and the support member 203 can be reused. In other embodiments, in order to decrease the thickness of the support member 203, the glue is applied to the support member 203 by spraying or by printing. As long as the conductive pads 301 can be electrically connected to the corresponding conductive ports 107 through the first through hole 205 and second through hole 207, a double faced adhesive tape can also be used to adhibit the card.

As discussed above, the card assembly 200 has two different groups of specification parameters, the mini card 300 can be compatible with the electronic device 100 which has a different group of specification parameters from the mini card 300. The mini card 300 can now be exchanged between the traditional mobile phones and the miniaturized mobile phones.

In other embodiments, the housing 201 and the support member 203 can be molded in one body. When the housing 201 and the support member 203 are made of different materials, the housing 201 and the support member 203 can be integrated as a double injection process.

In other embodiments, the electronic device 100 can be a notebook computer, a digital camera, or any portable electronic device. The mini card 300 also can be a storage card, such as a secure digital memory card, or a compact flash card.

It is to be understood, however, that even though numerous embodiments have been described with reference to particular embodiments, but the present disclosure is not limited to the particular embodiments described and exemplified, and the embodiments are capable of considerable variation and modification without departure from the scope of the appended claims.

What is claimed is:

1. A card assembly being received in a recess with a first size in an electronic device for receiving a card with the first size; the card assembly comprising:
a housing with the first size and capable of being received in the recess of the electronic device; and
wherein the housing defines a receiving space with a second size which is different from the first size, the receiving space is capable of firmly receiving a card with the second size in the recess by the housing, when the card assembly, with the card in the second size, is received in the recess, the card with the second size is directly and electrically connected to the first electronic device; the card assembly further comprises a support member attached to the housing, the support member defines a through hole, the through hole is opposite to the receiving space, the through hole is smaller than the receiving space to support the card when the card is received in the receiving space.

2. The card assembly of claim 1, wherein the card comprises a plurality of conductive pads, the electronic device comprises a plurality of conductive ports corresponding to the plurality of conductive pads, when the card assembly, with the card, is received in the electronic device, the conductive ports are electrically connected to the corresponding conductive pads through the receiving space and the through hole.

3. The card assembly of claim 1, wherein the support member comprises a film.

4. The card assembly of claim 1, wherein the support member is firmly attached on the housing by a glue, when the card is received in the receiving space, the support member adhibits the card.

5. The card assembly of claim 4, wherein the glue is applied to the support member by spraying.

6. The card assembly of claim 1, wherein the housing and the support member are molded in one body.

7. The card assembly of claim 1, wherein the housing and the support member are made of different materials.

8. The card assembly of claim 1, wherein the second group of specification parameters comprises a shape and a thickness.

9. An electronic device, comprising:
a body defining a recess with a first size for receiving a card with the first size;
a card with a second size which is different from the first size; and
a card assembly with the first size and capable of being received in the recess, the card assembly comprising:
a housing with the first size being capable of receiving in the recess; and
wherein the housing defines a receiving space with a second size which is different from the first size, the receiving space is capable of firmly receiving a card with the second size in the recess by the housing;
when the card assembly, with the card with the second size, is received in the recess, the card with the second size is directly and electrically connected to the electronic device; the card assembly further comprises a support member attached to the housing, the support member defines a through hole, the through hole is opposite to the receiving space, and is smaller than the receiving space to support the card when the card is received in the receiving space.

10. The electronic device of claim 9, wherein the card comprises a plurality of conductive pads, the electronic device comprises a plurality of conductive ports corresponding to the plurality of conductive pads, when the card assembly, with the card, is received in the recess, the conductive ports are electrically connected to the corresponding conductive pads through the receiving space and the through hole.

11. The electronic device of claim 9, wherein the support member comprises a film.

12. The electronic device of claim 9, wherein the housing and the support member are molded in one body.

13. The electronic device of claim 9, wherein the housing and the support member are made of different materials.

* * * * *